(12) United States Patent
Meier et al.

(10) Patent No.: US 6,731,193 B2
(45) Date of Patent: May 4, 2004

(54) PRINTED CIRCUIT BOARD-BASED CURRENT SENSOR

(75) Inventors: Heinz W. Meier, Kalletal (DE); Klaus Brand, Bad Salzuflen (DE); Klaus Eisert, Blomberg (DE); Christoph Leifer, Bad Driburg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 10/053,842

(22) Filed: Jan. 22, 2002

(65) Prior Publication Data

US 2003/0137388 A1 Jul. 24, 2003

(30) Foreign Application Priority Data

Jan. 27, 2001 (DE) ...................................... 201 01 454 U

(51) Int. Cl.⁷ ................................................ H01F 5/00
(52) U.S. Cl. ........................ 336/200; 336/223; 336/232
(58) Field of Search ................................ 336/200, 223, 336/232, 65; 29/605

(56) References Cited

U.S. PATENT DOCUMENTS

| | | | |
|---|---|---|---|
| 5,414,400 A | | 5/1995 | Gris |
| 5,461,309 A | * | 10/1995 | Baudart ........................ 324/127 |
| 6,150,915 A | * | 11/2000 | O'Reilly et al. ............. 336/232 |
| 6,195,858 B1 | * | 3/2001 | Ferguson et al. ........... 29/25.42 |

FOREIGN PATENT DOCUMENTS

| | | |
|---|---|---|
| DE | 964896 | 5/1957 |
| DE | 1905468 | 9/1970 |
| DE | 2543828 C2 | 4/1977 |
| DE | 4017280 C2 | 1/1991 |
| DE | 4212461 A1 | 10/1993 |
| DE | 4229678 A1 | 3/1994 |
| DE | 19505812 C2 | 8/1996 |
| DE | 19740428 C2 | 3/1999 |

* cited by examiner

*Primary Examiner*—Anh Mai
(74) *Attorney, Agent, or Firm*—Charles E. Baxley

(57) ABSTRACT

The object of the invention is to provide a slotted current acquisition coil according to the Rogowski principle in which the printed circuit board base of the measuring coil can be opened to insert an electrical conductor to be measured without having to interrupt the latter. To this end, the two printed circuit board segments linked together by a hinge are opened. Twisting a single-piece printed circuit board also opens the arrangement for inserting the conductor to be measured.

11 Claims, 5 Drawing Sheets

PRINTED CIRCUIT BOARD-BASED CURRENT SENSOR

FIELD OF THE INENTION:

The invention relates to a device for measuring AC currents in the form of a current sensor according to the preamble of claim 1.

DESCRIPTION OF THE PRIOR ART

Inductive measuring procedures according to the Rogowski principle are known in the area of current measuring technology. In the known models, the current-carrying conductor is routed through a coil. The sensor coil can vary in design. One design was described in DE 195 05 812 C2, in which an electrically insulating annular element is provided as the winding carrier. However, the disadvantage to this design is that production requires numerous different steps. Another disadvantage is that, when setting up a current sensor with an integrated electronic evaluation or calculation circuit, the coil in the form described in DE 195 05 812 C2 as a component in addition to the electronic components of the evaluation or calculation circuit have to be placed, secured and electrically connected. Therefore, the integration of this coil into an electronic evaluation or corrective calculation circuit is associated with a high space requirement and high costs for manufacturing the device as a whole. The additional requirement that sensors be miniaturized to make increasingly smaller models tailored to the respective application available cannot be met with a current acquisition coil according to DE 195 05 812 C2. In the description of another design according to U.S. Pat. No. 5,414,400, the coil is fabricated directly on a printed circuit board using the printed conductors and through platings. Viewed in a radial direction, the printed circuit board segment between the through platings forms the electrically insulating annular element or annular segment. The printed conductors are oriented in such a way that the respective printed conductor on the top of the printed circuit board ends in a through plating for establishing an electrical connection with a printed conductor on the bottom, while the latter in turn ends in a through plating for establishing an electrical connection with an additional printed conductor on the top, thereby representing a winding around the insulating annular segment. The geometric orientation of the printed conductors yields a coil-like winding of the insulating annular segment, which, in its entirety, results in a current acquisition coil according to the Rogowski principle. The key disadvantage to the design described in U.S. Pat. No. 5,414,400 is that the current-carrying conductor must also be routed through the borehole enveloped by the coil. As a result, a current acquisition coil given this design cannot be placed around a current-carrying conductor for purposes of current acquisition at a later time. Another disadvantage is that the coil as designed has a go-and-return type of winding. It is proposed that the current acquisition coil be built around a two-layer printed circuit board, whose windings are quite symmetrically arranged over the entirety, but the individual windings alternate in dimensions. This disadvantage stems from the geometric requirement that the windings for practically two coils lying one inside the other be flatly accommodated on a printed circuit board.

OBJECT

The object of the invention is to realize an inexpensive, compact design for a device for measuring AC currents by means of a current acquisition coil based on a printed circuit board or a printed circuit board segment according to the Rogowski principle, which can at a later point be placed around and encompass the current-carrying conductor without interrupting the function of the current-carrying conductor. The structure of the windings must be very symmetrical in order to achieve a high measuring accuracy.

SOLUTION

The object is achieved according to the invention by virtue of the features cited in claim 1.

The device according to the invention for a current acquisition coil is realized with the help of a printed circuit board, which can be flipped open in such a way that the current-carrying conductor to be measured can be inserted in the provided area of the coil without interrupting or deactivating the current-carrying conductor. The opened device for a current acquisition coil is closed for measurement in such a way that the current-carrying conductor is completely enclosed by the current acquisition coil, and the current acquisition coil can measure the current of the current-carrying conductor according to the Rogowski principle. To satisfy additional requirements on the current acquisition coil relating to symmetrical structure or compactness, a multi-layer printed circuit board must be used. This offers more ways in which to control the printed conductor, and enables the most symmetrical structure possible for the current acquisition coil winding.

The printed circuit board of the device for measuring AC currents is dimensioned in such a way that additional electronic components of an evaluation unit can be arranged thereupon. Relative to prior art, this makes it possible as a whole to dimension on a smaller scale and be more cost effective. The evaluation unit can perform a measured value conversion for conditioning measured value signals for open-loop and closed-loop controllers, running comparisons with limiting values and generating "too-low" or "too-high" messages, or for other applications.

The multi-layer printed circuit board structure results in a symmetrical design for the individual windings. In this case, the windings of the coil segment for the first winding direction are arranged on two layers for the printed conductors provided exclusively for this coil segment. With respect to the windings of the coil segment for the second winding direction, e.g., return direction, there are two layers of printed conductors provided exclusively for this coil segment. This makes more free space available for the geometric configuration of the printed conductors.

The invention will be described based on an embodiment and the accompanying figures below.

DETAILED DESCRIPTION

Figure 1:
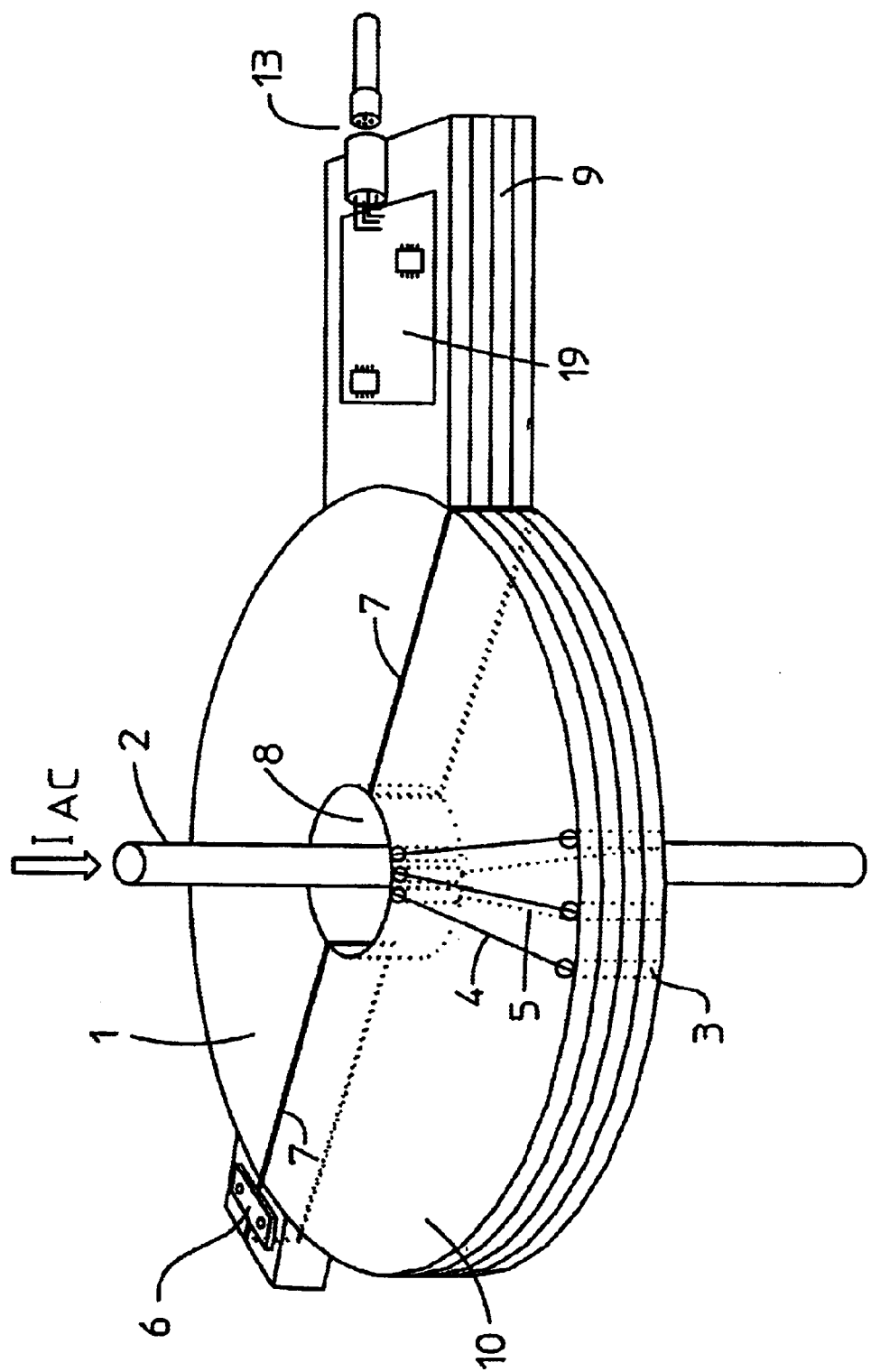
FIG. 1: The device according to the invention of a current sensor with a flip-open, printed circuit board-based current acquisition coil.

FIG. 1 shows the arrangement according to the invention of a current sensor with a flip-open, annular printed circuit board as the current acquisition coil. The hinge 6 provides a flip-open link between the one printed circuit board half 1 and the second printed circuit board half 10. The current-carrying conductor 2 with its current to be measured is axially oriented and routed through the middle of the current acquisition coil. The printed conductors of the individual layers are not shown, but are alluded to with 4 and 5. The additional part of the printed circuit board 9 is preferably used to hold electric or electronic components for an evaluation circuit 19, which issues a scaled measuring signal to the output 13.

Figure 2:
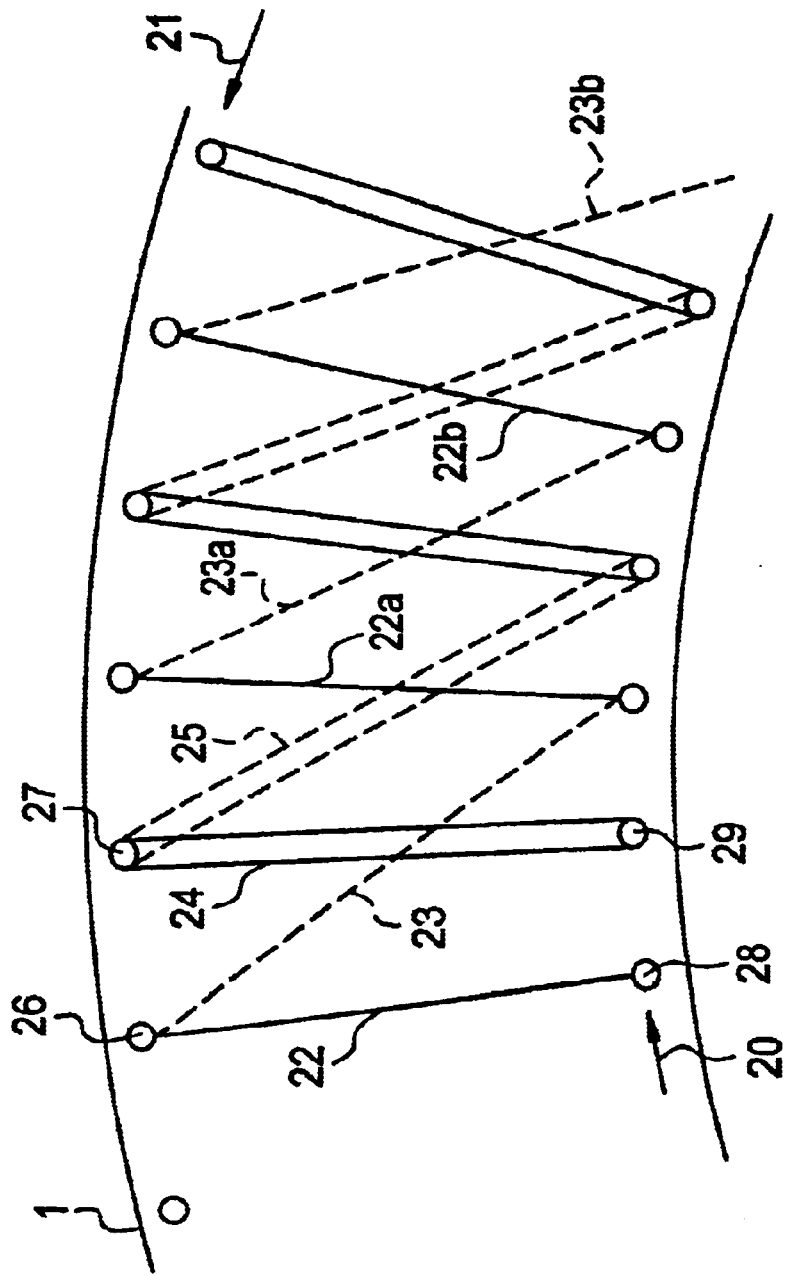
FIG. 2: The printed conductor progression for the coil segments involving the "go" path (20) and the "return" path (21) of the winding.

FIG. 2 shows the arrangement of printed conductors for generating a current acquisition coil. In this case, the printed conductors 22, 22a, 22b of the winding and the corresponding additional printed conductors on the top of the incoming coil winding 20 are on the first layer. The printed conductors 23, 23a, 23b along with the corresponding additional printed conductors on the bottom of the incoming coil segment are located on the fourth layer, which is isolated from all other layers. The printed conductors 24 and corresponding additional printed conductors on the top for the returning coil segment 21 are located on the second layer, which is isolated from all other layers. The printed conductors 25 and corresponding additional printed conductors on the bottom for the returning coil segment are located on the third layer, which is isolated from all other layers. Since layers one and four are each arranged on the outside of the printed circuit board, while layers three and four are situated on the inside layers of the multi-layer printed circuit board, a returning coil segment 21 lying spatially in the incoming coil segment 20 comes about. Therefore, the incoming coil segment 20 is wound in the opposite direction as the returning coil segment 21.

Figure 3:
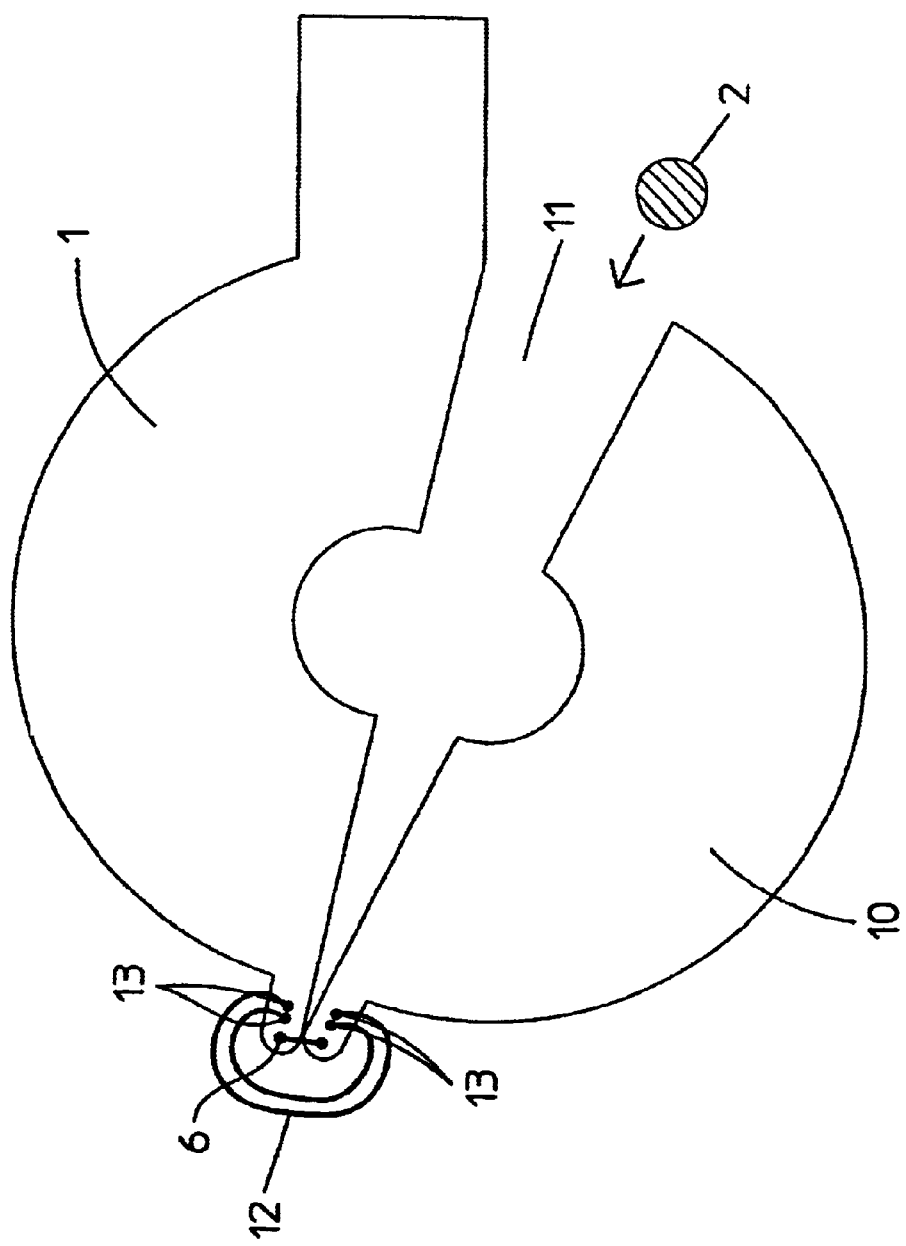
FIG. 3: Flipped-open printed circuit board of the current acquisition coil.

FIG. 3 shows the flip-open printed circuit board of the current acquisition coil in the flipped-open state for enveloping the current-carrying conductor 2. The printed conductor parts 1 and 10 are flipped open and spread apart until the current-carrying conductor 2 fits through the arising gap 11, and the current sensor can be passed over the current-carrying conductor in the direction of the arrow. The hinge 6 must permit the rotational movement of individual printed circuit board halves or only one printed circuit board half necessary to achieve a maximal gap width 11. Flexible conductors 12 are used to electrically connect one half of the current acquisition coil 1 in direct proximity to the hinge 6 with the other half of the current acquisition coil 10 with the help of electrical terminals 13 in the manner required for current acquisition according to the Rogowski principle.

Figure 4:
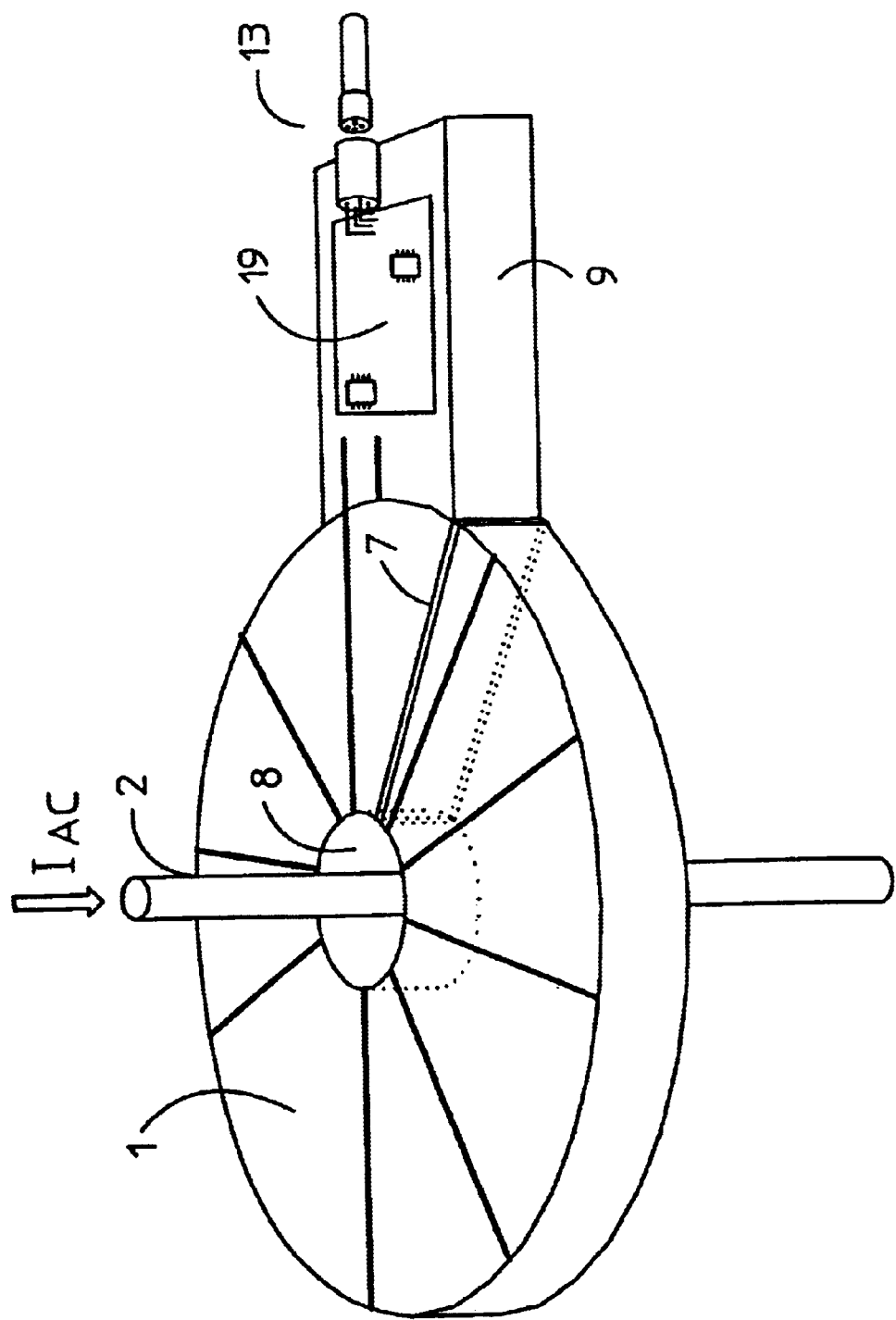
FIG. 4: A variant of the device of the current acquisition coil as a single-piece printed circuit board with only one slot in the device, which can be placed around the conductor to be measured by opening the printed circuit board via twisting.

FIG. 4 shows a variant of a current acquisition coil to be opened on a single-piece, multi-layer printed circuit board, which has only one gap 7 as the unilateral opening for enveloping the current-carrying conductor 2. By applying a force to twist the printed circuit board, the gap 7 is widened to such an extent that the current-carrying conductor 2 can be moved in a radial direction through the gap. A printed circuit board segment 9 not used for the coil preferably serves to hold electric or electronic components for an evaluation circuit 19, which issues a scaled measuring signal to the output 13.

Figure 5:
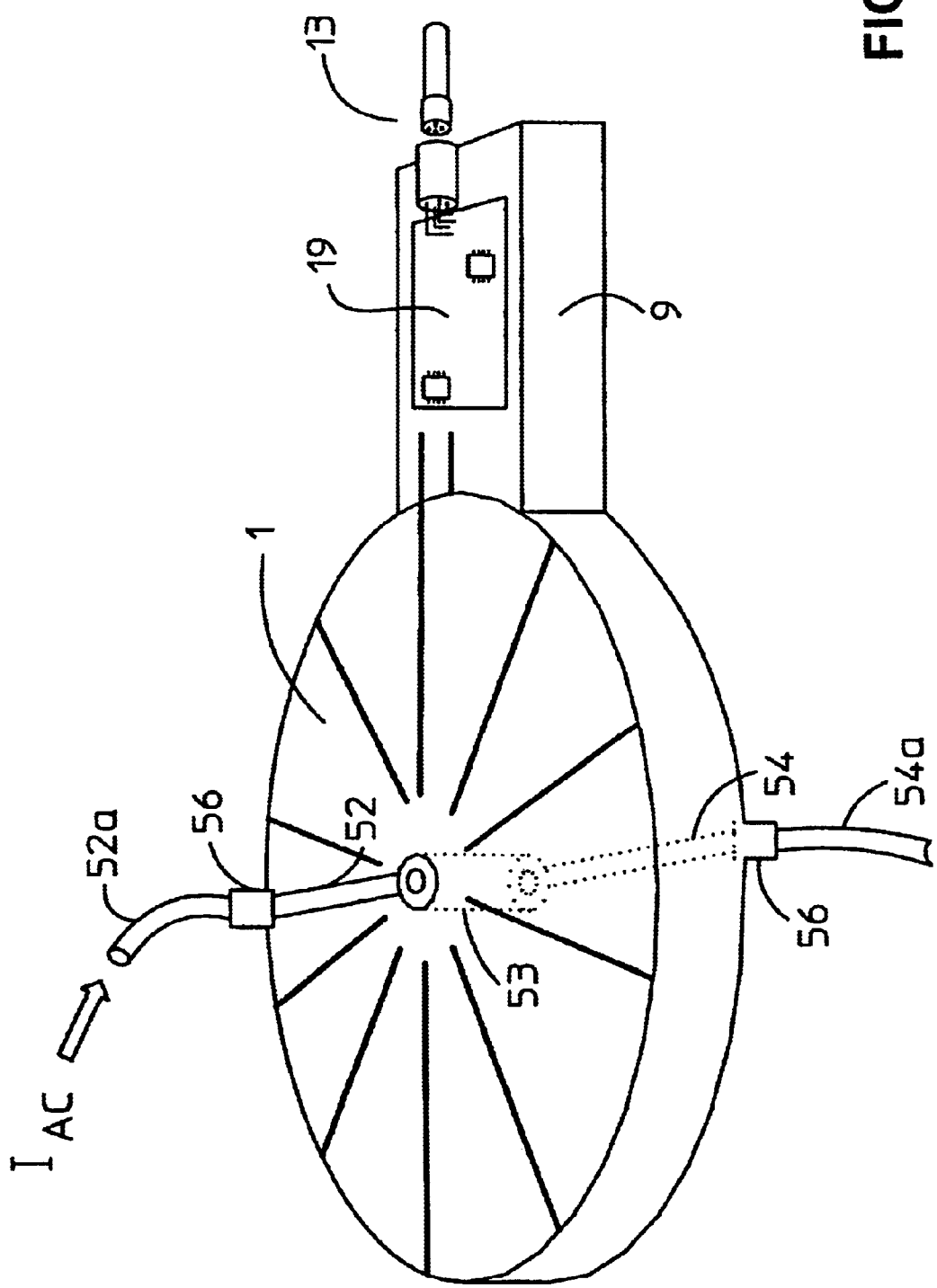
FIG. 5: A variant of the device of the current acquisition coil as a single-piece printed circuit board with printed conductors and through plating to route through the current to be measured.

FIG. 5 shows a single-piece current acquisition coil on a multi-layer printed circuit board, in which the current-carrying conductor 52a, 54a is routed in an axial direction through the printed circuit board as a through plating 53. The terminals are routed via the current-carrying printed conductor 52 to the incoming current-carrying conductor 52a, and via the current-carrying printed conductor 54 to the continuing current-carrying conductor 54a. To ensure that the current to be acquired is relayed in an axial direction through the printed circuit board, the current-carrying printed conductors and printed circuit board terminals 56 are arranged on the outside of the printed circuit board 1. In this configuration, the current-carrying conductor is hooked up to the external current-carrying conductor parts 52a and 54a via electrical connectors 56. A printed circuit board segment 9 not used for the coil is preferably used to hold electric or electronic components for an evaluation circuit 19, which issues a scaled measuring signal to the output 13. The arrangement shown on FIG. 5 is particularly advantageous for permanently fixed current sensors, which are no longer moved around after installation.

What is claimed is:

1. A current acquisition coil according to the Rogowski principle with printed conductors (22, 23, 24, 25), whose configuration yields a coil winding (20, 21), and whose printed conductor ends are connected to each other by through platings (26, 27, 28, 29) on a printed circuit board (1, 10), wherein the current acquisition coil is open on at least one side, thereby generating a gap (7) that can be opened and then closed again.

2. A current acquisition coil according to claim 1, wherein the printed circuit board (1, or 1 and 10) of the current acquisition coil is made of several layers.

3. A current acquisition coil according to claim 2, wherein two layers are provided for the printed conductors of an incoming winding (22, 22a, 23, 23a), and two additional layers are provided for the printed conductors of a returning winding (24, 24a, 25, 25a).

4. A current acquisition coil according to claim 1, 2, or 3, wherein components for an electronic evaluation circuit (19), which issues a scaled signal to an output (13), are arranged on a printed circuit board segment (9) not used for the coil.

5. A current acquisition coil according to the Rogowski principle with printed conductors (22, 23, 24, 25), whose arrangement yields a coil winding (20, 21), and whose printed conductor ends are connected to each other by through platings (26, 27, 28, 29) on a printed circuit board (1, 10), wherein printed circuit board (1, 10) for a conductor to be measured accommodates electrical terminals (56), which are connected to each other via printed conductors (52, 54) and at least one through plating (53) in an axial direction in a center of the coil.

6. A current acquisition coil according to claim 5, wherein the printed circuit board (1, or 1 and 10) of the current acquisition coil is made of several layers.

7. A current acquisition coil according to claim 6, wherein two layers are provided for the printed conductors of an incoming winding (22, 22a, 23, 23a), and two additional layers are provided for the printed conductors of a returning winding (24, 24a, 25, 25a).

8. A current acquisition coil according to claim 5, 6, or 7, wherein components for an electronic evaluation circuit (19), which issues a scaled signal to an output (13), are arranged on a printed circuit board segment (9) not used for the coil.

9. A current acquisition coil according to the Rogowski principle with printed conductors (22, 23, 24, 25), whose configuration yields a coil winding (20, 21), and whose printed conductor ends are connected to each other by through platings (26, 27, 28, 29) on a printed circuit board (1, 10), wherein the current acquisition coil is open on at least one side, thereby generating a gap (7) that can be opened and then closed again, wherein the coil comprises two annular printed circuit board segments (1, 10), which are connected to each other on one side by a hinge (6).

10. A current acquisition coil according to the Rogowski principle with printed conductors (22, 23, 24, 25), whose configuration yields a coil winding (20, 21), and whose printed conductor ends axe connected to each other by through platings (26, 27, 28, 29) on a printed circuit board (1, 10), wherein the current acquisition coil is open on at least one side, thereby generating a gap (7) that can be opened and then closed again, wherein the printed conductor ends (13) of the coil winding on a first printed circuit board segment (1) are connected by means of flexible conductors (12) with the printed conductor ends (13) of the coil winding on a second printed circuit board segment (10).

11. A current acquisition coil according to the Rogowski principle with printed conductors (22, 23, 24, 25), whose configuration yields a coil winding (20, 21), and whose printed conductor ends are connected to each other by through platings (26, 27, 28, 29) on a printed circuit board (1, 10), wherein the current acquisition coil is open on at least one side, thereby generating a gap (7) that can be opened and then closed again, wherein the coil comprises a single-piece, slitted, and twistable printed circuit board segment (1).

* * * * *